United States Patent
Xie et al.

(10) Patent No.: US 11,404,131 B2
(45) Date of Patent: Aug. 2, 2022

(54) DECISION FOR EXECUTING FULL-MEMORY REFRESH DURING MEMORY SUB-SYSTEM POWER-ON STAGE

(71) Applicant: Micron Technology, Inc., Boise, ID (US)

(72) Inventors: Tingjun Xie, Milpitas, CA (US); Zhenlei Shen, Milpitas, CA (US); Zhenming Zhou, San Jose, CA (US)

(73) Assignee: MICRON TECHNOLOGY, INC., Boise, ID (US)

( * ) Notice: Subject to any disclaimer, the term of this patent is extended or adjusted under 35 U.S.C. 154(b) by 96 days.

(21) Appl. No.: 16/510,735

(22) Filed: Jul. 12, 2019

(65) Prior Publication Data

US 2021/0012845 A1    Jan. 14, 2021

(51) Int. Cl.
| | |
|---|---|
| G11C 16/34 | (2006.01) |
| G11C 16/26 | (2006.01) |
| G06F 3/06 | (2006.01) |
| G11C 16/20 | (2006.01) |
| G11C 16/30 | (2006.01) |

(52) U.S. Cl.
CPC ........ *G11C 16/3418* (2013.01); *G06F 3/0619* (2013.01); *G06F 3/0658* (2013.01); *G06F 3/0683* (2013.01); *G11C 16/26* (2013.01)

(58) Field of Classification Search
None
See application file for complete search history.

(56) References Cited

U.S. PATENT DOCUMENTS

| | | | |
|---|---|---|---|
| 8,621,266 B2* | 12/2013 | Kang | G06F 11/1068 714/6.11 |
| 2010/0265764 A1 | 10/2010 | Yoo et al. | |
| 2014/0153315 A1* | 6/2014 | Kwon | G11C 29/50008 365/148 |
| 2017/0062065 A1* | 3/2017 | Shim | G11C 16/20 |
| 2017/0075574 A1 | 3/2017 | Oikawa et al. | |
| 2017/0365352 A1* | 12/2017 | Shin | G11C 16/3418 |
| 2019/0095264 A1 | 3/2019 | Tsem et al. | |
| 2019/0102088 A1* | 4/2019 | Fang | G06F 11/1004 |

FOREIGN PATENT DOCUMENTS

EP    2549482 A1    1/2013

OTHER PUBLICATIONS

IEEE Dictionary of Standards Terms, Seventh edition (Year: 2019).*
International Search Report and Written Opinion for International Application No. PCT/US2020/041402, dated Oct. 13, 2020, 12 pages.

* cited by examiner

*Primary Examiner* — April Y Blair
*Assistant Examiner* — Matthew W Wahlin
(74) *Attorney, Agent, or Firm* — Lowenstein Sandler LLP (57) ABSTRACT

A system includes a plurality of memory devices and a processing device (e.g., a controller), operatively coupled to the plurality of memory devices. The processing device is to detect a power-on of the system and determine a read-retry trigger rate (TR) of a subset of codewords of the plurality of memory devices during a time interval after an initialization of the memory component. The processing device is further to determine whether the TR satisfies a threshold criterion. In response to the TR not satisfying the threshold criterion, the processing device is to initialize a full-memory refresh of the plurality of memory devices.

19 Claims, 6 Drawing Sheets

```
┌─────────────────────────────────────────────────────────────┐
│ Detect power-on of memory sub-system, which includes one or │
│ more memory device(s).                                      │
│ 410                                                         │
└─────────────────────────────────────────────────────────────┘
                              │
                              ▼
┌─────────────────────────────────────────────────────────────┐
│ Determine read-retry trigger rate (TR) based on one or more │
│ logical units of the memory device(s) during a time interval│
│ after initialization of the memory sub-system.              │
│ 420                                                         │
└─────────────────────────────────────────────────────────────┘
                              │
                              ▼
                  ◇ Does TR satisfy threshold    Yes
                    criterion? 430  ─────────────────┐
                              │                      │
                              │ No                   │
                              ▼                      │
┌─────────────────────────────────────────────────┐  │
│ Initialize a full-memory refresh (possibly      │  │
│ mixed with host traffic).                       │  │
│ 440                                             │  │
└─────────────────────────────────────────────────┘  │
                              │                      │
                              ▼                      │
┌─────────────────────────────────────────────────┐  │
│ Cause memory sub-system to enter a normal       │◄─┘
│ operating mode (e.g., operation without         │
│ full-memory refresh).                           │
│ 450                                             │
└─────────────────────────────────────────────────┘
```

┌─────────────────────────────────────────────────┐
│ Detect power-on of memory sub-system, which includes one or more │
│ memory component(s). │
│ 510 │
└─────────────────────────────────────────────────┘
                          ↓
┌─────────────────────────────────────────────────┐
│ Initiate cell refresh operation on cells of a subset of codewords of the │
│ one or more memory components(s), the cell refresh operations │
│ including read operations performed on the cells. │
│ 520 │
└─────────────────────────────────────────────────┘
                          ↓
┌─────────────────────────────────────────────────┐
│ Determine read-retry trigger rate (TR) based on the read operations │
│ performed on the subset of codewords during a time interval after │
│ actual initialization of the memory sub-system. │
│ 530 │
└─────────────────────────────────────────────────┘
                          ↓
              ◇ Does TR satisfy threshold ◇ ──Yes──┐
                criterion? 540                     │
                          │                        │
                          No                       │
                          ↓                        │
┌─────────────────────────────────────────────────┐│
│ Initialize a full-memory refresh (possibly mixed with host traffic). ││
│ 550 ││
└─────────────────────────────────────────────────┘│
                          ↓                        │
┌─────────────────────────────────────────────────┐│
│ Cause memory sub-system to enter a normal operating mode │←┘
│ (e.g., operation without full-memory refresh). │
│ 560 │
└─────────────────────────────────────────────────┘

DECISION FOR EXECUTING FULL-MEMORY REFRESH DURING MEMORY SUB-SYSTEM POWER-ON STAGE

TECHNICAL FIELD

Embodiments of the disclosure relate generally to memory sub-systems, and more specifically, related to deciding whether to execute a full-memory refresh during memory sub-system power-on stage.

BACKGROUND

A memory sub-system can be a storage system, a memory module, or a hybrid of a storage device and memory module. The memory sub-system can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure.

DETAILED DESCRIPTION

Aspects of the present disclosure are directed to deciding whether to execute a full-memory refresh during a memory sub-system power-on stage. A memory sub-system can be a storage device, a memory module, or a hybrid of a storage device and memory module. Examples of storage devices and memory modules are described below in conjunction with FIG. 1. In general, a host system can utilize a memory sub-system that includes one or more memory components or devices. The host system can provide data to be stored at the memory sub-system and can request data to be retrieved from the memory sub-system.

The memory sub-system can include multiple memory components or memory devices that can store data from the host system. In various embodiments, the cell voltage threshold (Vt) distribution density, which represents the statistical distribution of threshold voltages of memory cells, varies with time, including increased voltage drift over time (whether or not a memory sub-system is powered on). Combined with noise present when memory cells are read, a single read level may not be sufficient to meet system reliability targets for reading the bits. In practice, multiple read levels can be employed by a memory controller (hereinafter "controller") in order to restore the data stored in the memory. Normally a read operation starts at a low voltage level and then moves to higher voltage levels on read retries if the read operation fails at first. This is due to the partial write effect of a read operation, to avoid the distortion of Vt distribution density based just on read attempts.

In disclosed embodiments, a restore of voltage states (e.g., of the Vt distribution density) within the memory cells can be performed via cell refresh operations, including a read operation, a write operation, or a combination thereof. A write cell refresh can be a write-in-place operation where a voltage level state is first determined (with a read) and then the state is rewritten to the same memory cell as before, resetting the cell back to original threshold voltages. If a memory sub-system has been powered off for a long time, the cell Vt distribution density can have migrated significantly higher, which if remain, lead to a higher read-retry trigger rate (TR) on subsequent read attempts. Higher TR results in degraded system quality of service (QoS) and customer experience with accessing memory. The TR is increased for each retry of a read operation due to failing to read targeted data, e.g., where error-correcting code (ECC) fails to decode the data on the media retrieved by an initial read operation. The need to retry the read operation is likely when the initial, low-voltage read attempts are too low with reference to an optimal read voltage.

Conventionally, the controller (e.g., processing device of the memory sub-system) is configured to either never or always perform a full-memory refresh operation upon detecting a power-on of the memory sub-system. A full-memory refresh operation refers to a procedure that refreshes every cell in the memory sub-system (usually at least one codeword of cells at a time), which can take from a few to tens of minutes to finish. A decision to always perform a full-memory refresh can cause unnecessary refreshing of memory, causing a throughput penalty during power on, extra cell wearing, degraded customer experience during power-on, and possible compromise of endurance and/or reliability of the memory sub-system. Taking the opposite approach, however, to never perform a full-memory refresh operation after power-on of the memory sub-system, can lead to a high TR and degraded QoS during operation of the memory sub-system, negatively impacting customer experience during normal operation.

Aspects of the present disclosure address the above and other deficiencies by the processing device performing, upon power-on of the memory sub-system, a detection of a level of the read-retry trigger rate, or TR during a fixed period of time after power-on of the memory sub-system. If the TR satisfies (e.g., is within) an acceptable threshold criterion, no full-memory refresh is needed, and normal operation can proceed with read and write operations that can also selectively perform some cell refresh. If the TR does not satisfy (e.g., is not within) the acceptable threshold criterion, a full-memory fresh can be performed on the memory device(s) before entering normal operation. To satisfy the threshold criterion, the TR can be less than a TR requirement value (TRreq) optionally multiplied by a scaling factor, where the scaling factor is less than one ("1"). In this way, the decision of whether to do a full-memory fresh of memory cells can be made on a memory component, device, or memory sub-system level after a power-on operation.

In embodiments, a memory sub-system is operatively coupled to a processing device, wherein the memory sub-system includes one or more memory device(s). The processing device can detect a power-on of the sub-system and determine a read-retry trigger rate (TR) based on read attempts of a subset of codewords stored at the memory device(s) during a time interval after initialization of the memory sub-system. A codeword is the smallest set of data that is individually protected by ECG The processing device can further determine whether the TR satisfies a threshold criterion. In response to the TR not satisfying the threshold criterion, the processing sub-system can initialize a full-memory refresh of the memory component(s) or device(s). In response to the TR satisfying the threshold criterion, the processing device can enter a normal operating mode without the full-memory refresh.

Advantages of the present disclosure include but are not limited to the intelligent initiation of full-memory refresh based on actual conditions of the memory sub-system, measured right after power-on in terms of TR levels of cells of a subset of codewords stored at the memory device(s). Avoiding an all-or-nothing approach to full-memory refresh after the power-on stage can also avoid unnecessary wear of memory cells and improve system throughput, latency profile, and overall customer experience during both the power-on stage and during normal operation of the memory sub-system. Other advantages will be apparent to those skilled in the art in the features of the memory-subsystem discussed hereinafter.

Figure 1:
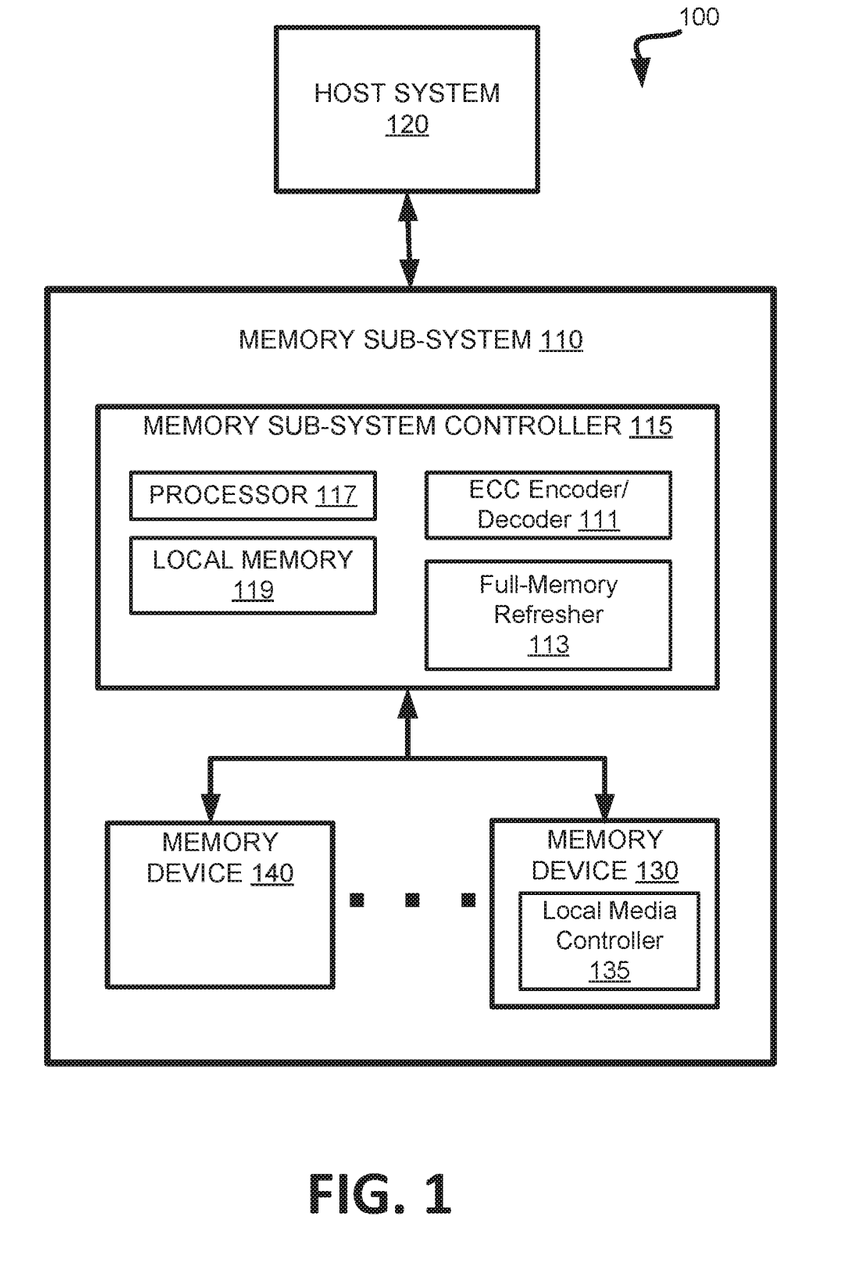
FIG. 1 illustrates an example computing environment that includes a memory sub-system in accordance with some embodiments of the present disclosure.

FIG. 1 illustrates an example computing environment 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such. Each memory device 130 or 140 can be one or more memory component(s).

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing environment 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. The host system 120 uses the memory sub-system 110, for example, to write data to the memory sub-system 110 and read data from the memory sub-system 110. As used herein, "coupled to" generally refers to a connection between components or devices, which can be an indirect communicative connection or direct communicative connection (e.g., without intervening components or devices), whether wired or wireless, including connections such as electrical, optical, magnetic, etc.

The host system 120 can be a computing device such as a desktop computer, laptop computer, network server, mobile device, embedded computer (e.g., one included in a vehicle, industrial equipment, or a networked commercial device), or such computing device that includes a memory and a processing device. The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components (e.g., memory devices 130) when the memory sub-system 110 is coupled with the host system 120 by the PCIe interface. The physical host interface can provide an interface for passing control, address, data, and other signals between the memory sub-system 110 and the host system 120.

The memory devices can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

An example of non-volatile memory devices (e.g., memory device 130) includes a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased.

Although non-volatile memory components such as 3D cross-point type memory are described, the memory device 130 can be based on any other type of non-volatile memory, such as negative-and (NAND), read-only memory (ROM), phase change memory (PCM), self-selecting memory, other chalcogenide based memories, ferroelectric random access memory (FeRAM), magneto random access memory (MRAM), negative-or (NOR) flash memory, and electrically erasable programmable read-only memory (EEPROM).

The cells can store one or more bits per cell. In one embodiment, each of the memory devices 130 can include one or more arrays of memory cells such as single level cells (SLCs), multi-level cells (MLCs), triple level cells (TLCs), or quad-level cells (QLCs), or a combination of such. In some embodiments, a particular memory component or device can include an SLC portion, and an MLC portion, a TLC portion, or a QLC portion of memory cells. Each of the memory cells can store one or more bits of data used by the host system 120. Furthermore, the memory cells of the memory devices 130 can be grouped as memory pages, memory blocks, or codewords that can refer to a logical unit of the memory component or device used to store data.

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor (processing device) 117 configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 may not include a memory sub-system controller 115, and may instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical block address and a physical address that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. In some embodiments, the memory devices 130 are managed memory devices (e.g., managed NAND), which is a raw memory device combined with a local controller (e.g., the local media controller 135) for memory management within the same memory device package.

In some embodiments, the controller 115 includes an error-correcting code (ECC) encoder/decoder 111 and a full-memory refresher 113. The ECC encoder/decoder 111 can perform ECC encoding and decoding within data written to the memory devices 130 and data read from the memory devices 130, respectively. The ECC decoding can be performed to decode an ECC codeword to verify whether or not there is an error in the data, and in some cases, to correct that error.

In embodiments, the full-memory refresher 113 can operate to detect the TR of the memory devices 130, and perform the comparison with the threshold criterion to determine whether to initiate a full-memory refresh of the memory devices. In one embodiment, the threshold criterion is that the TR is less than a TR requirement value (TRreq). In another embodiment, the threshold criterion is that the TR is less than the TRreq multiplied by a scaling factor ($\alpha$), where the scaling factor is less than one ("1"). Further details with regards to the operations of the full-memory refresher 113 are described below.

In some embodiments, the controller 115 includes at least a portion of the full-memory refresher 113. Further, the controller 115 can include a processor 117 (processing device) configured to execute instructions stored in local memory 119 for performing the operations described herein. In some embodiments, the full-memory refresher 113 is part of the host system 120, an application, or an operating system.

Figure 2A:
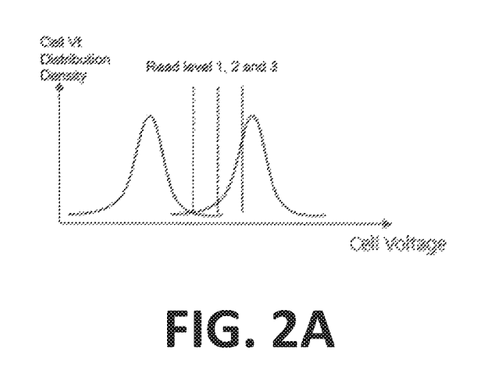
FIG. 2A is a graph that represents cell voltage threshold distribution density versus cell voltage illustrating a short write-to-read (W2R) delay according to an embodiment of the present disclosure.

FIG. 2A is a graph that represents cell voltage threshold (Vt) distribution density versus cell voltage illustrating a short write-to-read (W2R) delay according to an embodiment of the present disclosure. Due to the time-varying nature of the Vt distribution density, in addition to other noise mechanisms in memory, a single read level is not sufficient to meet system reliability targets for memory cells. Multiple read levels (e.g., the illustrated three levels) can be used in combination to achieve low bit error rate (BER). As illustrated, in one embodiment, the Vt distribution density is distributed across the cell voltage in a way that necessitates different read levels, as illustrated from left to right, read level one ("1") at the lowest voltage, read level two ("2") at a middle voltage, and read level three ("3") at a higher voltage. In embodiments, the Vt distribution density is a function of write-to-read (W2R) delay.

Figure 2B:
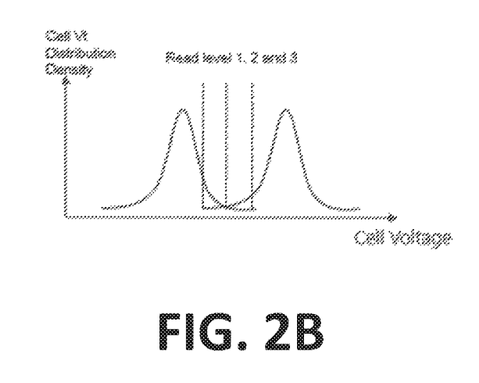
FIG. 2B is a graph that represents cell voltage threshold distribution density versus cell voltage illustrating a medium W2R delay according to an embodiment of the present disclosure.
Figure 2C:
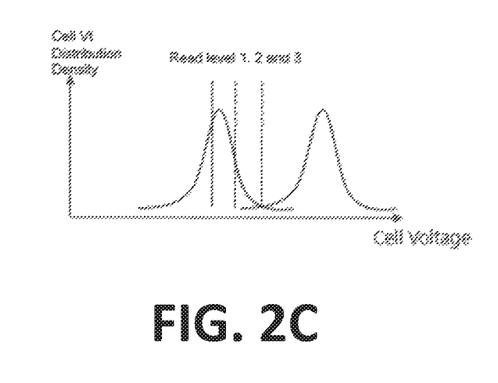
FIG. 2C is a graph that represents cell voltage threshold distribution density versus cell voltage illustrating a long W2R delay according to an embodiment of the present disclosure.

For example, a recently refreshed and updated W2R delay can be short, as illustrated in FIG. 2A. But, over time, these illustrated Vt distribution density can drift, e.g., whether or not the memory sub-system is powered down, as a function of increasingly longer W2R delay. The W2R delay of FIG. 2B can be referred to as a medium W2R delay and that of FIG. 2C can be referred to as a long W2R delay, in comparison to the short W2R delay of FIG. 2A. For some memories such as a cross-point array of non-volatile memory, for example, a read operation on a cell has a partial write effect. If the read operation voltage is too high in terms of cell Vt distribution density, the read operation can distort the Vt distribution density and cause subsequent read operations to have higher BER. Due to this impact of read operations, a memory controller (e.g., processing device) can generally read with a lowest voltage first, and retry with gradually higher voltages used for subsequent reads.

To improve the Vt distribution density, the memory controller can perform cell refresh operations on cells in the form of codeword in the memory sub-system, e.g., in a size of an error correction code (ECC) word. These cell refresh operations can be done randomly, sequentially, or using some other systematic approach. In some cases, the cell refresh operations are performed naturally in conjunction with read operations. While a partial refresh can be performed with a read operation, a more complete refresh operation can be performed with an in-place write to restore Vt distribution density of the cells to a distribution corresponding to a short W2R delay. Performance of such cell refresh operations can improve the robustness of the ability to read the memory cells despite exposure to disturbances and noise. For example, the controller 115 will not need to perform retry reads as often despite using the lowest read voltage for an initial read attempt on the codewords.

In different embodiments, cell refresh operations are performed in a variety of ways. For example, the memory controller can rewrite to cells in the form of codeword(s) using a current state of each respective cell, e.g., either with a single in-place write or multiple in-place writes. As a second example, the memory controller can rewrite each cell an even number of times with alternating states. Thus, if a cell has a one value, the memory controller can write a zero to that cell followed by rewriting the one into that cell. As a third example, the memory controller can read each cell because a read can partially rewrite the data of each cell. As a fourth example, the memory controller can rewrite each cell if read statistics (such as fail bit count (FBC) and/or certain error recovery flow sequence) of the cells indicates that the Vt distribution density of the cells includes an unacceptably long W2R delay. The rewrite options also involve read operations to these cells, as read operations can first be used to obtain a voltage state of the cells before writing the contents of the cells back into those respective cells.

In embodiments, for a normally operating memory sub-system, the memory sub-system exhibits regular (e.g., a short) W2R delay within Vt distribution densities (FIG. 2A) due to continuous write and read operations to the memory sub-system. After a memory sub-system is powered off, however, the memory sub-system can go through a long time period before being powered back on. At this time, the voltage states of the cells can migrate much higher than normal, creating unacceptably high W2R delay (e.g., FIG. 2C). Due to the partial write effect, the memory controller is to perform reads with a lowest voltage first. But, after a long period of time being powered off, the memory sub-system is expected to have a high read-retry trigger rate (or "TR"), degraded quality of service (QoS), including throughput, a poor latency profile, and the like. The challenge here is that the memory sub-system does not have information indicative of how long it has been powered off.

In some embodiments, in the case of a long period of being powered off, a full-memory refresh is performed to redress the Vt distribution densities caused by long W2R delays before entering a normal operating mode with acceptably low W2R delays. The full-memory refresh can be of a memory component or can be of an entirety of the memory sub-system 110, e.g., of the memory device 130.

Figure 3A:
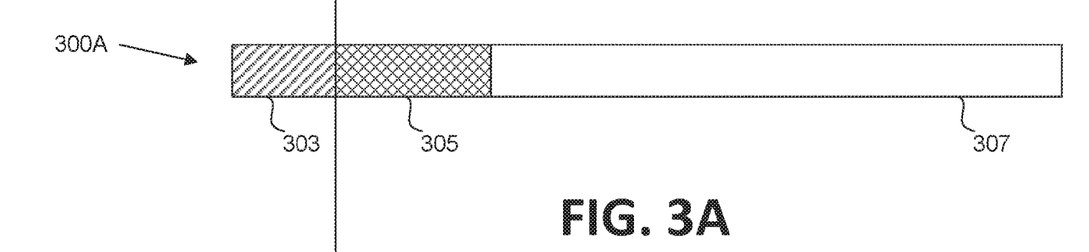
FIG. 3A is a time diagram illustrating phases of memory sub-system power-on according to some embodiments of the present disclosure.

FIG. 3A is a time diagram 300A illustrating phases of memory sub-system power-on according to some embodiments of the present disclosure. In the example of FIG. 3A, the host system 120 that is interfacing with the memory sub-system 110 allows a (short) designated initialization period 303 during which the memory sub-system can initialize itself without accepting any host commands, including read operations from the host system 120. The host system 120 can also allow a designated reduced performance period 305 (after the designated initialization period 303) during which the memory sub-system 110 can accept host commands and Vt distribution density can be stabilized before returning to a normal operating mode 307. A full-memory refresh operation on cells of the memory device 130 can be carried out during a time duration that is covered by the designated initialization period 303 and/or the designated reduced performance period 305. In at least one embodiment, the time duration spans a predetermined period of time immediately following the actual initialization of the memory sub-system. As will be discussed with reference to FIGS. 3B-3C, these time periods can vary in time depending on how fast the memory sub-system performs actual initialization.

As discussed herein, before performing a full-memory refresh of the memory sub-system 110, the controller 115 (e.g., the full-memory refresher 113) can determine, during the time interval after the actual initialization of the memory sub-system 110, whether the memory cell conditions merit performing the full-memory refresh. The time interval can be more or less than one second or be a decimal value. In one embodiment, the time interval can be between 3-8 seconds, to provide the time to track and obtain an accurate value for TR over a period of time. The determination of whether to perform full-memory refresh can be made via a comparison of a read-retry trigger rate (TR) with a QoS specification of the host system 120, referred to herein as a TR requirement value (TRreq). In one embodiment, the TRreq is a threshold criterion for making the comparison with a value of the TR. If the TR is less than the TRreq (e.g., TR<TRreq), then the TR meets this threshold criterion and no full-memory refresh is initiated. If the TR is greater than or equal to the TRreq, however, then a full-system refresh is initiated.

In embodiments, because the host system 120 might not want even close calls in this comparison to get by without a full-memory refresh when one is arguably needed, the TRreq can be multiplied by a scaling factor ($\alpha$), which is less than one and can be referred to as a guard band value. This scaling factor is to provide additional margin that can take into consideration possibly delayed managerial refresh that the host system 120 might issue, and thus tend to make the TR value have to be lower to avoid a full-memory refresh. For example, the equality now to avoid a full-memory refresh can be TR<$\alpha$*TRreq, where $\alpha$ can be tuned by the host system 120 in setting the QoS specification depending on application needs and delays in managerial refresh typically expected within the memory sub-system 110.

Figure 3B:
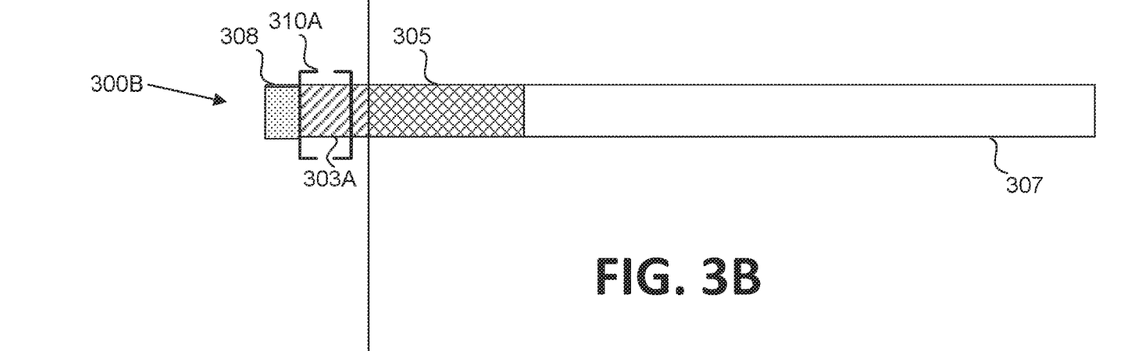
FIG. 3B is a time diagram illustrating the phases of FIG. 3A and a time interval during which to determine a read-retry trigger rate (TR) of the memory sub-system according to an embodiment of the present disclosure.
Figure 3C:
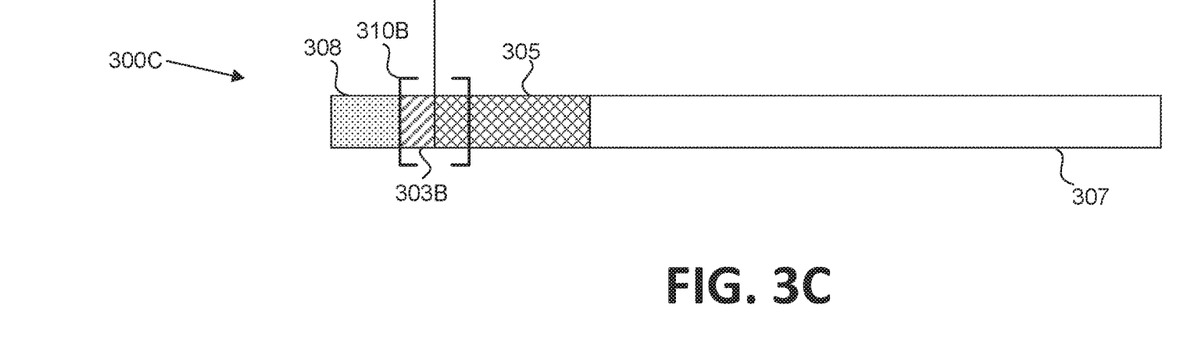
FIG. 3C is a time diagram illustrating the phases of FIG. 3C and a time interval during which to determine the TR of the memory sub-system according another embodiment of the present disclosure.

Because the TR (e.g., the TR value) is to be used for comparison, the controller 115 can determine the TR within the time interval after the actual initialization of the memory sub-system 110, as indicated by the bracket in FIG. 3B and FIG. 3C, and before entering into the normal operating mode 307. The way the TR value is determined can vary depending on how long the actual initialization takes, and thus can be determined from one or both of host read operations, issued by the host system 120, or individual cell refresh operations, which can be issued by the controller 115. The method that can be deployed during the designated system initialization period 303 is via cell refresh operations (which initiate separate read operations) as the host read operations are not allowed until after designated system initialization period 303. In one embodiment, the controller 115 can determine read success/failure of up to several million codewords in order to determine the TR value and whether to perform a full system refresh.

FIG. 3B is a time diagram 300B illustrating the phases of FIG. 3A and a time interval 310A during which to determine a read-retry trigger rate (TR) of the memory sub-system 110 according to an embodiment of the present disclosure. In the time diagram 300B, an actual initialization period 308 requires less time than allotted by the designated initialization period 303. Further, in this example, because the actual initialization period 308 completes during the designated initialization period 303, the controller 115 can still start up cell refresh operations during what remains of the designated initialization period, indicated as remaining portion 303A. As illustrated, the time interval 310A used to calculate the TR value completes during the remaining portion 303A of the designated initialization period 303. In this way, the memory sub-system 110 can determine whether to perform a full refresh even before entering the designated reduced performance period 305, expediting the decision in furtherance of improving system performance and user experience during power-on of the memory sub-system 110.

FIG. 3C is a time diagram 300C illustrating the phases of FIG. 3A and a time interval 310B during which to determine the TR of the memory sub-system 110 according to another embodiment of the present disclosure. In the time diagram 300C, the actual initialization period 308 requires more time than in the time diagram 300B of FIG. 3B. In this example, the time interval 310B during which to determine the TR spans across a (shorter) remaining portion 303B of the designated initialization period 303. Accordingly, the controller 115 can start up cell refresh operations during remaining portion 303B of the designated initialization period 303. Because the time interval 310B during which to determine the TR value and whether to perform full-memory refresh still requires additional time, the time interval 310B extends into the designated reduced performance period 305. During the portion of the time interval 310B within the designated reduced performance period 305, the controller 115 can continue performing cell refresh operations, but can also accept and fulfill host read operations, among other host memory operations. Accordingly, determination of the TR can be based on the host read operations, the cell refresh operations, or a combination of the two during the designated reduced performance period 305. In one embodiment, the actual initialization 308 takes up the entire designated initialization period 303, and therefore, the time interval 310B would be shifted completely within the designated reduced performance period 305 (not illustrated). Thus, depending on how long system initialization takes during power-on of the memory sub-system, the controller 115 can use different combinations of host read operations and/or cell refresh operations with which to determine the value for TR, and thus decide whether to do a full-memory refresh.

With continued reference to FIGS. 3B-3C, note that the time periods of the actual initialization period and the time intervals 310A and 310B, in comparison to the designated reduced performance period 305, are not drawn to scale, but are drawn for purposes of facilitating explanation. For example, the time intervals 310A and 310B are typically a few seconds while the designated reduced performance period 305 can last up to a few minutes. Further, the duration and relative length of these various time periods can vary some or can vary significantly from system to system depending on design, age, and wear leveling, among other factors.

Figure 4:
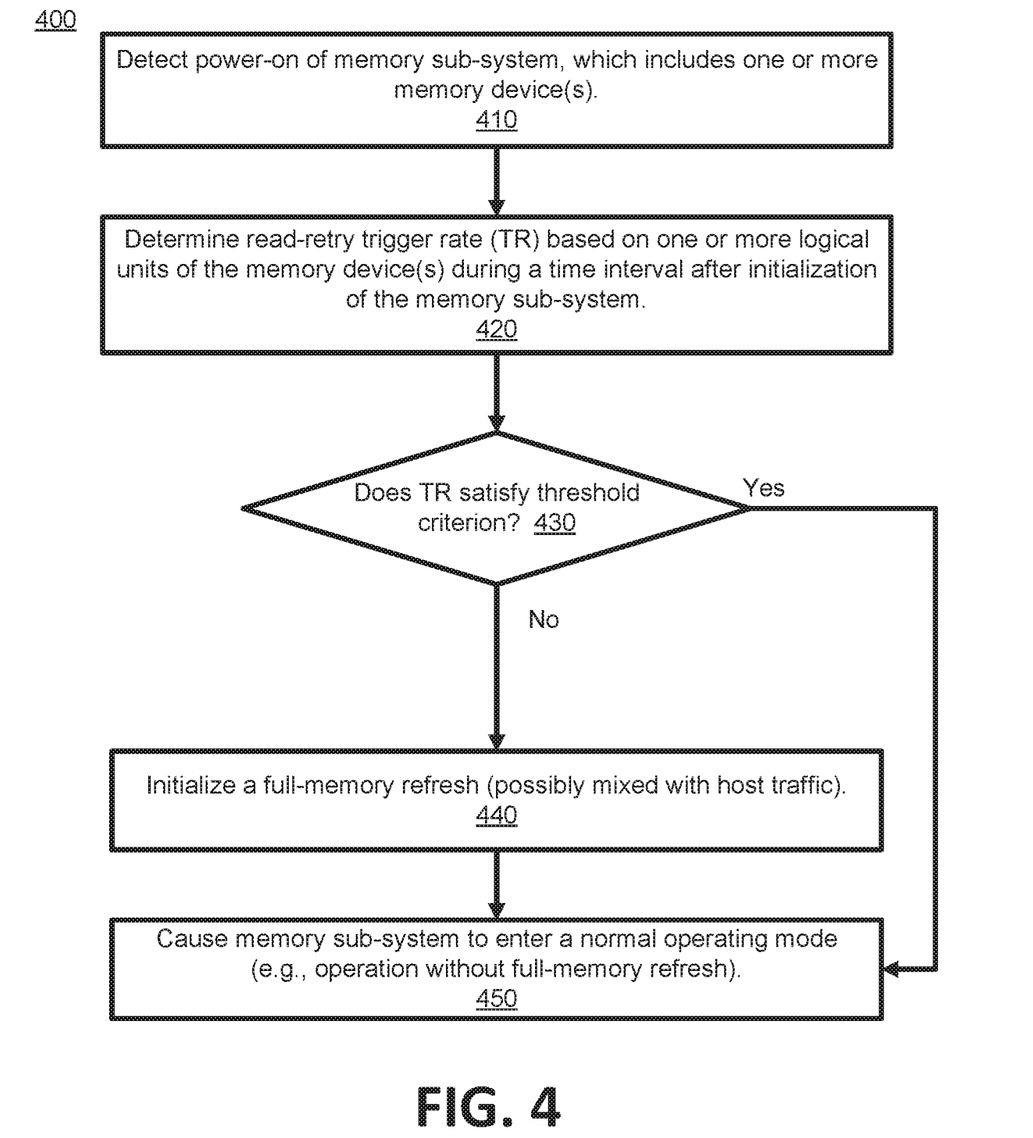
FIG. 4 is a flow diagram of an example method to decide whether to execute full-memory refresh during a memory sub-system power-on stage in accordance with embodiments of the present disclosure.

FIG. 4 is a flow diagram of an example method 400 to decide whether to execute full-memory refresh during a memory sub-system power-on stage in accordance with embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the controller 115 (e.g., the full-memory refresher 113) of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 410, the processing logic detects a power-on of the memory sub-system, which includes one or more memory device(s). For example, the power-on can be detected after a long period of being powered off, but the processing logic does not know for how long. Accordingly, the processing logic can be configured to move into a diagnosis of whether to perform a full-memory refresh after being powered on and after initialization.

At operation 420, the processing logic determines a read-retry trigger rate (TR) based on one or more logical units of the memory device(s) during a time interval after initialization of the memory sub-system. For example, each logical unit can include one or more codewords. The TR can be determined as a ratio of the number of read retries invoked by the read operations to the number of read operations performed. For example, a read operation normally starts at a low voltage so as not to prematurely reset Vt distribution density with the read operation of stored data. If the Vt distribution density has already migrated higher, however, the initial low voltage read attempt can fail. A subsequent read attempt (e.g., a retry) can be performed at a higher voltage, e.g., an incrementally higher voltage by some amount. Each retry of a read operation due to a previous failure to read the stored data contributes to the overall TR. A value of the TR can be determined based on read operations of the memory device(s) by at least one of a host system coupled to the processing device or cell refresh operations performed by the processing logic. As noted with reference to FIGS. 3A-3C, the processing logic can perform the cell refresh operations on the one or more logical units at least one of during or after the designated initialization period 303 of the memory sub-system. Further, the processing logic can pass the read operations from the host system to the memory device(s) during the designated reduced performance period 305 after the designated initialization period 303 of the memory sub-system.

At operation 430, the processing logic determines whether the TR satisfies a threshold criterion. In one embodiment, to satisfy the threshold criterion, the TR is to be less than a TR requirement value (TRreq). In another embodiment, to satisfy the threshold criterion, the TR is to be less than the TR requirement value multiplied by a scaling factor (TR<$\alpha$*TRreq), where the scaling factor is less than one ("1"). For purpose of explanation, the TRreq can be $1\times10^{-10}$ while assuming the scaling factor ($\alpha$) is 0.75, creating different available levels of the threshold criterion.

At operation 440, the processing logic initializes a full-memory refresh (possibly mixed with host traffic) in response to the TR not satisfying the threshold criterion. The host traffic can entail servicing memory operations from the host system. For example, an unacceptably high value for TR could be $1\times10^{-2}$, $1\times10^{-1}$, or higher, indicating the cells of the one or more logical units are being read at inappropriate voltage levels. In this case, the processing logic can initialize a full-memory refresh due to failing to satisfy the threshold criterion. In different embodiments, the full-memory refresh is performed in a variety of ways. For example, the processing logic can rewrite to cells of every logical unit on the memory device(s) using a current state of each respective cell, e.g., either with a single in-place write or multiple in-place writes. As a second example, the processing logic can rewrite each cell an even number of times with alternating states. Thus, if a cell has a one value, the processing logic can write a zero to that cell followed by rewriting the one into that cell. As a third example, the memory controller can read each cell because a read can partially rewrite the data of each cell of the memory. As a fourth example, the processing logic can rewrite each cell if read statistics (such as FBC and/or certain error recovery flow sequence) of the cells indicates that the Vt distribution density of the cells includes an unacceptably long W2R delay. The rewrite options also involve read operations to these cells, as read operations can first be used to obtain a voltage state of the cells before writing the contents of the cells back into those respective cells.

At operation 450, the processing logic causes the memory sub-system to enter a normal operation mode (e.g., operation without full-memory refresh) in response to the TR satisfying the threshold criterion. A low (and therefore good) value for TR could be $1\times10^{-4}$, $1\times10^{-5}$, or even lower, indicating the cells of the one or more logical units are being read at appropriate voltage levels. In these cases, the processing logic can go right into normal operating mode due to satisfying the threshold criterion. The values for TR, TRreq, and α are for explanatory purposes only and in no way limit the scope of other possible embodiments applied to the principles discussed herein.

In this way, the memory sub-system 110 provides intelligent initiation of full-memory refresh based on actual conditions of the memory sub-system, measured right after power-on in terms of TR levels of one or more logical units of cells. Avoiding an all-or-nothing approach to full-memory refresh after the power-on stage can also avoid unnecessary wear of memory cells and improve system throughput, latency profile, and overall customer experience during both the power-on stage and during normal operation of the memory sub-system.

Figure 5:
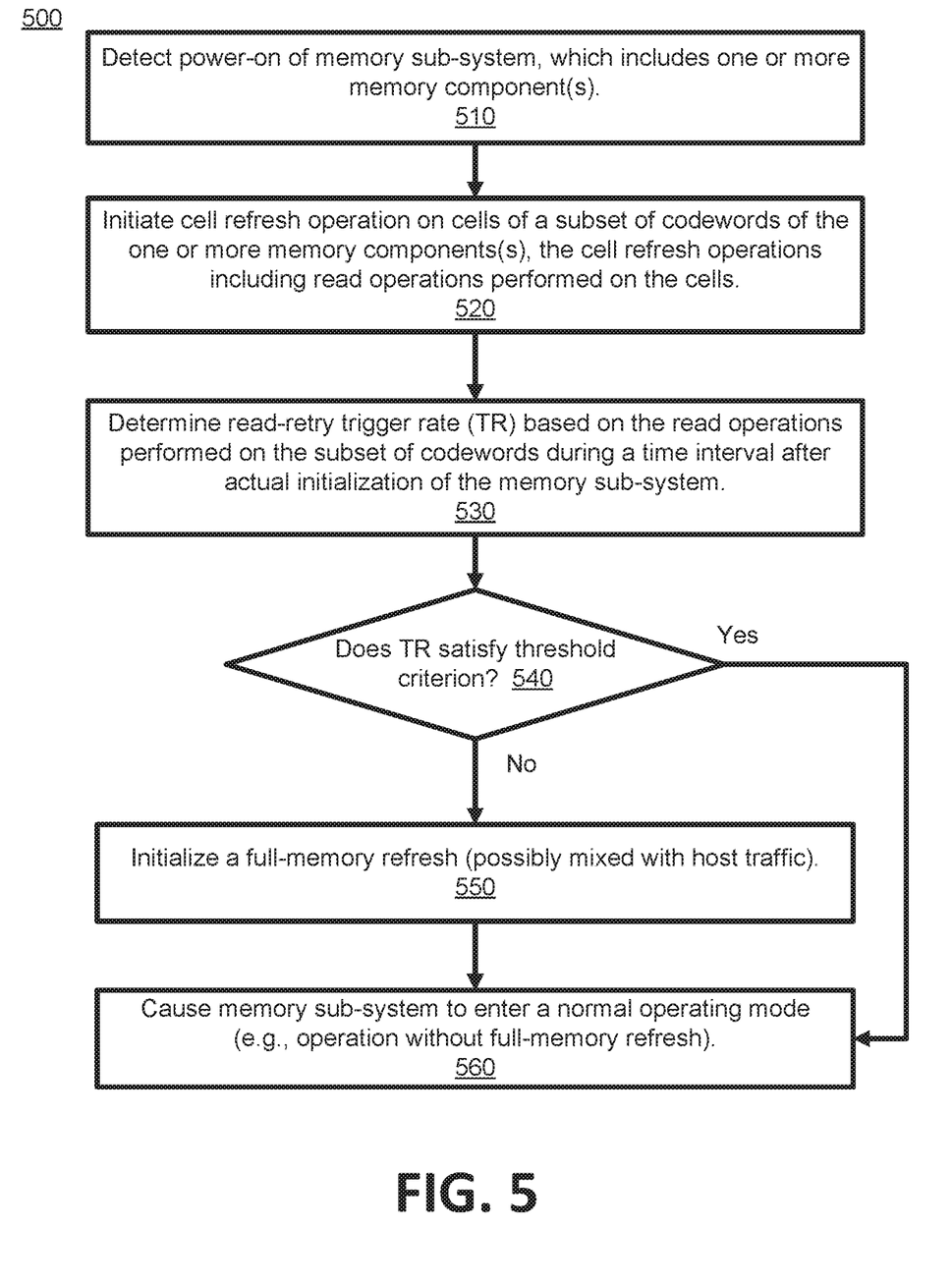
FIG. 5 is a flow diagram of an example method to decide whether to enter normal operating mode during a system sub-system power-on stage in according with embodiments of the present disclosure.

FIG. 5 is a flow diagram of an example method to decide whether to enter normal operating mode during a system sub-system power-on stage in according with embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the controller 115 (e.g., the full-memory refresher 113) of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 510, the processing logic detects a power-on of the memory sub-system, which includes one or more memory component(s). For example, the power-on can be detected after a long period of being powered off, but the processing logic does not know for how long. Accordingly, the processing logic can be configured to move into a diagnosis of whether to perform a full-memory refresh after being powered on and after actual initialization.

At operation 520, the processing logic initiates cell refresh operations on cells of a subset of codewords of the one or more of memory component(s), the cell refresh operations including read operations performed on the cells. These cell refresh operations may be performed during a designated initialization period and/or the designated reduced performance period and be performed for the purpose of testing where the read-retry trigger rate (TR) is at after power-on of the memory sub-system. These cell refresh operations are discussed in more detail with reference to FIGS. 3A-3C.

At operation 530, the processing logic determines the TR based on the read operations performed on the subset of codewords during a time interval after actual initialization of the memory sub-system, where the time interval includes the designated initialization period. The TR may be determined at least based on these cell refresh read operations, but may also further be determined based on second read operations of the one or more memory component(s) issued by a host system during a designated reduced performance period after the designated initialization period. The TR may be fully determined during the time interval that includes both the designated initialization period and at least a portion of the designated period of reduced performance.

At operation 540, the processing logic determines whether the TR satisfies a threshold criterion. In one embodiment, to satisfy the threshold criterion, the TR is to be less than a TR requirement value (TRreq). In another embodiment, to satisfy the threshold criterion, the TR is to be less than the TR requirement value multiplied by a scaling factor (TR<α*TRreq), where the scaling factor is less than one ("1"). For purpose of explanation, the TRreq can be $1\times10^{-10}$ while assuming the scaling factor (α) is 0.75, creating different available levels of the threshold criterion.

At operation 550, the processing logic initializes a full-memory refresh (possibly mixed with host traffic) in response to the TR not satisfying the threshold criterion. The host traffic can entail servicing memory operations from the host system. For example, an unacceptably high value for TR could be $1\times10^{-2}$, $1\times10^{-1}$, or higher, indicating the cells of the subset of codewords are being read at inappropriate voltage levels. In this case, the processing logic can initialize a full-memory refresh due to failing to satisfy the threshold criterion.

At operation 560, the processing logic causes the memory sub-system to enter a normal operation mode (e.g., operation without full-memory refresh) in response to the TR satisfying the threshold criterion. A low (and therefore good) value for TR could be $1\times10^{-4}$, $1\times10^{-5}$, or even lower, indicating the subset of codewords of cells are being read at appropriate voltage levels. In these cases, the processing logic can go right into normal operating mode due to satisfying the threshold criterion. The values for TR, TRreq, and α are for explanatory purposes only and in no way limit the scope of other possible embodiments applied to the principles discussed herein.

In this way, the memory sub-system 110 provides intelligent initiation of full-memory refresh based on actual conditions of the memory sub-system, measured right after power-on in terms of TR levels of one or more codewords of cells. Avoiding an all-or-nothing approach to full-memory refresh after the power-on stage can also avoid unnecessary wear of memory cells and improve system throughput, latency profile, and overall customer experience during both the power-on stage and during normal operation of the memory sub-system.

Figure 6:
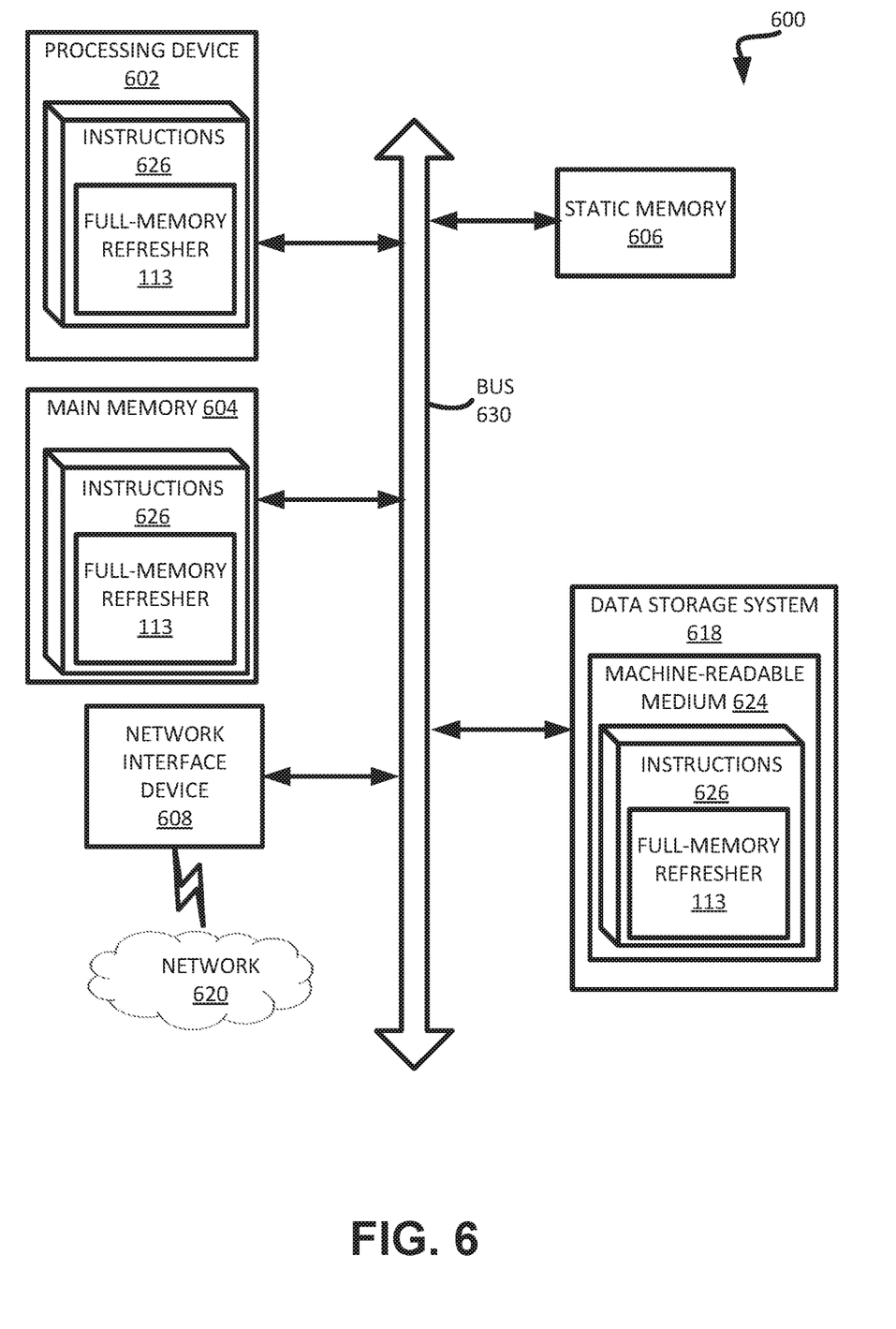
FIG. 6 is a block diagram of an example computer system in which embodiments of the present disclosure can operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller 115 (e.g., to execute an operating system to perform operations corresponding to the full memory refresher 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to an error determining component (e.g., the full memory refresher 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
   a plurality of memory devices storing a set of codewords; and
   a processing device, operatively coupled to the plurality of memory devices, to:
      detect a power-on of the system;
      in response to detection of the power-on of the system, determine a read-retry trigger rate (TR), based on a subset of codewords stored at the plurality of memory devices, during a time interval directly after an initialization of the plurality of memory devices and one of before or at a beginning of a reduced performance time period that precedes a normal operating mode of the plurality of memory devices, wherein the reduced performance time period is a first reduced performance time period after the power-on of the system and no full-memory refresh operation is performed during the normal operating mode;
      determine whether the TR satisfies a threshold criterion; and
      in response to the TR not satisfying the threshold criterion, initialize the full-memory refresh operation of the plurality of memory devices.

2. The system of claim 1, wherein, in response to the TR satisfying the threshold criterion, the processing device is further to cause the system to enter a normal operating mode without the full-memory refresh operation.

3. The system of claim 1, wherein to satisfy the threshold criterion, the TR is to be less than a TR requirement value.

4. The system of claim 1, wherein the TR is determined based on at least one of:
   first read operations of the plurality of memory devices comprising cell refresh operations performed by the processing device; or
   second read operations of the plurality of memory devices issued by a host system coupled to the system.

5. The system of claim 4, wherein the processing device is to perform the cell refresh operations on a subset of codewords at least one of during or after a designated initialization period of the plurality of memory devices.

6. The system of claim 4, wherein the processing device is to pass the second read operations from the host system to the plurality of memory devices during a designated reduced performance period after the initialization of the plurality of memory devices.

7. The system of claim 1, wherein the time interval comprises a time period of less than one second.

8. A system comprising:
   a plurality of memory components; and
   a processing device, operatively coupled to the plurality of memory components, to:
      detect a power-on of the system;
      initiate, at least during a designated initialization period that follows directly after the power-on of the system, cell refresh operations on a subset of codewords stored at the plurality of memory components, the cell refresh operations comprising read operations performed on the subset of codewords;
      determine a read-retry trigger rate (TR) based on the read operations performed on the subset of codewords during a time interval directly after actual initialization of the system, wherein the time interval overlaps with the designated initialization period, wherein the time interval comprises a time period before entering a normal operating mode, and no full-memory refresh operation is performed during the normal operating mode;
      determine whether the TR satisfies a threshold criterion; and
      in response to the TR satisfying the threshold criterion, cause the system to enter the normal operating mode without performance of the full-memory refresh operation.

9. The system of claim 8, wherein, in response to the TR not satisfying the threshold criterion, the processing device further to initialize the full-memory refresh operation of the plurality of memory components.

10. The system of claim 8, wherein to satisfy the threshold criterion, the TR is to be less than a TR requirement value multiplied by a scaling factor, wherein the scaling factor is less than one ("1").

11. The system of claim 8, wherein the TR is further determined based on second read operations of the plurality of memory components issued by a host system during a designated reduced performance period after the designated initialization period.

12. The system of claim 8, wherein the processing device is to perform the cell refresh operations on the subset of codewords also after the designated initialization period.

13. A method comprising:
   detecting, by a processing device of a memory sub-system, a power-on of the memory sub-system, wherein the memory sub-system comprises a plurality of memory devices;
   determining, by the processing device in response to the detecting, a read-retry trigger rate (TR) based on a plurality of logical units stored at a plurality of memory devices during a time interval directly after initialization of the memory sub-system and one of before or at a beginning of a reduced performance time period that precedes a normal operating mode of the plurality of memory devices, wherein each logical unit comprises one or more codewords, wherein the reduced performance time period is a first reduced performance time period after the power-on of the system and no full-memory refresh operation is performed during the normal operating mode;

determining, by the processing device, whether the TR satisfies a threshold criterion; and in response to the TR not satisfying the threshold criterion, initializing the full-memory refresh operation of the plurality of memory devices of the memory sub-system.

14. The method of claim 13, wherein, in response to the TR satisfying the threshold criterion, the method further comprising causing the memory sub-system to enter the normal operating mode without performing the full-memory refresh operation.

15. The method of claim 13, wherein satisfying the threshold criterion comprises the TR being less than a TR requirement value multiplied by a scaling factor, wherein the scaling factor is less than one ("1").

16. The method of claim 13, wherein determining the TR comprises determining the TR based on at least one of:

first read operations of the plurality of memory devices, the first read operations comprising cell refresh operations performed by the processing device; or second read operations of the plurality of memory devices issued by a host system coupled to the memory sub-system.

17. The method of claim 16, further comprising performing the cell refresh operations on the plurality of logic units at least one of during or after a designated initialization period of the memory sub-system.

18. The method of claim 17, further comprising passing the second read operations from the host system to the memory sub-system during a designated reduced performance period after the designated initialization period of the memory sub-system.

19. The method of claim 13, wherein the full-memory refresh operation is mixed with servicing memory operations received from a host system.

* * * * *